(12) United States Patent
Cho

(10) Patent No.: US 6,339,386 B1
(45) Date of Patent: Jan. 15, 2002

(54) VARIABLE LENGTH CODER OF A VIDEO CODER

(75) Inventor: Hyun Duk Cho, Kyonggi-do (KR)

(73) Assignee: LG Information & Communications Ltd., Seoul (KR)

( * ) Notice: Subject to any disclaimer, the term of this patent is extended or adjusted under 35 U.S.C. 154(b) by 0 days.

(21) Appl. No.: 09/418,573

(22) Filed: Oct. 15, 1999

(30) Foreign Application Priority Data

Dec. 30, 1998 (KR) .............................. 98/61814

(51) Int. Cl.[7] .................................. H03M 7/40
(52) U.S. Cl. .................. 341/67; 341/100; 341/101; 348/403
(58) Field of Search .............................. 341/67, 58, 59, 341/63, 100, 101, 60; 358/133

(56) References Cited

U.S. PATENT DOCUMENTS

| | | | |
|---|---|---|---|
| 4,805,722 A | | 2/1989 | Keating et al. |
| 5,245,428 A | * | 9/1993 | De With et al. ............ 358/133 |
| 5,436,626 A | * | 7/1995 | Fujiwara et al. ............. 341/67 |
| 5,519,260 A | | 5/1996 | Washington |
| 5,557,271 A | * | 9/1996 | Rim et al. .................... 341/67 |
| 5,686,765 A | | 11/1997 | Washington |
| 5,796,743 A | * | 8/1998 | Bunting et al. ............. 370/474 |
| 5,835,145 A | * | 11/1998 | Ouyang et al. ............. 348/403 |
| 6,014,095 A | * | 1/2000 | Yokoyama ................... 341/67 |

FOREIGN PATENT DOCUMENTS

| | | |
|---|---|---|
| DE | 43 32 411 A1 | 3/1995 |
| DE | 43 33 586 A1 | 4/1995 |
| DE | 44 24 735 A1 | 2/1996 |
| DE | 195 15 123 C1 | 8/1996 |
| DE | 296 02 609 U1 | 7/1997 |
| FR | 2 713 173 A1 | 6/1995 |

OTHER PUBLICATIONS

Shaw–Min Lee and Ming–Ting Sun, "An Entropy Coding System for Digital HDT", IEEE Transactions on Circuits and Systems for Video Technology, vol. 1, No. 1, Mar. 1991, pp. 147–155.

* cited by examiner

Primary Examiner—Brian Young
Assistant Examiner—John Nguyen
(74) Attorney, Agent, or Firm—Fleshner & Kim, LLP

(57) ABSTRACT

A variable length coder and encoding method of a video coder is disclosed. The present variable length coder includes a code buffer, a length buffer, and a bit packer of one register and one counter. Accordingly, the present invention allows a VLC with a compact size as well as lower power consumption.

27 Claims, 5 Drawing Sheets

FIG.7

| time | parallel/serial register(420) | down counter (410) | read | serial/parallel register(620) | down counter (610) | write |
|---|---|---|---|---|---|---|
| 0 | xxxxxxxx | x | 1 | xxxxxxxx | x | 0 |
| 1 | 000xxxxx | 2 | 0 | xxxxxxxx | 0 | 0 |
| 2 | 00xxxxxx | 1 | 0 | xxxxxxx0 | 7 | 0 |
| 3 | 0xxxxxxx | 0 | 1 | xxxxxx00 | 6 | 0 |
| 4 | 01xxxxxx | 1 | 0 | xxxxx000 | 5 | 0 |
| 5 | 1xxxxxxx | 0 | 1 | xxxx0000 | 4 | 0 |
| 6 | 1xxxxxxx | 0 | 1 | xxx00001 | 3 | 0 |
| 7 | 0010xxxx | 3 | 0 | xx000011 | 2 | 0 |
| 8 | 010xxxxx | 2 | 0 | x0000110 | 1 | 0 |
| 9 | 10xxxxxx | 1 | 0 | 00001100 | 0 | 1 |
| 10 | 0xxxxxxx | 0 | 1 | 00011001 | 7 | 0 |
| ⋮ | ⋮ | ⋮ | ⋮ | ⋮ | ⋮ | ⋮ |

VARIABLE LENGTH CODER OF A VIDEO CODER

FIELD OF THE INVENTION

The present invention relates to a video coder and more particularly to a variable length coder and encoding method in the video coder. The present invention is especially applicable in wireless communications such as mobile stations or phones which simultaneously request both voice and image transmission services.

DISCUSSION OF RELATED ART

In a communication system, a video coder generally encodes image signals to be transmitted prior to the transmission. The video coder may utilize a variable length coder (VLC) to encode coefficients processed through a discrete cosign transform (DCT) and quantized by a quantizer. A coding system utilizing a VLC is disclosed in "An Entropy Coding System for Digital HDTV Applications," *IEEE Transactions on Circuits and Systems for Video Technology*, vol. 1, no. 1, pp. 147–55 (March 1991) and is herein incorporated.

Generally, the VLC encodes the input data into variable length codes, concatenates the codes, and segments the codes into a predetermined code length of the VLC. The predetermined code length is greater than or equal to the maximal code length of the VLC. FIG. 1 shows a typical VLC in the related art including a VLC code generator 10, a bit packer 20, and a channel buffer 30. The VLC code generator 10 generates and transmits the code information and the code length information to the bit packer 20. The bit packer 20 accumulates the received code information for the duration of the predetermined code length of the VLC and outputs the accumulated code information to the channel buffer 30. The channel buffer 30 then stores and outputs the bit stream of the code information to a subsequent processor at a constant rate.

Also, a typical construction of the bit packer 20, shown in FIG. 2, includes two barrel shifters 21 and 22, an accumulator 23, a plurality of registers 24–28, and a flip-flop (F/F) 29. To concatenate and segment the code information into the predetermined code length, the bit packer 20 performs bit packing of the code information, the barrel shifter 21 concatenates the to input codes to the bit stream stored in the register and the barrel shifter 22 segments the bit stream according to the predetermined code length. The accumulator 23 adds the input code length and informs the barrel shifter 22 upon attaining the predetermined code length. Namely, an enabling signal is transmitted from the adder 23 to the one bit flip-flop (F/F) each time the accumulator 23 attains the predetermined code length. This signal informs the channel buffer 30 to read and store the codes from the bit packer 20.

The bit packer 20 as explained above can process one input code per each system clock and is effective for processing high definition broadcasting signals. However, the implementation of the above explained VLC is very complicated. Utilizing two barrel shifters and one adder, the bit packer alone requires numerous logic gates. As a result, the VLC cannot be implemented in a compact device and the power consumption of the VLC is high.

Thus, the VLC in the related art may be effective for devices requiring high speed processing such as digital HDTV, but for compact devices such as mobile phones in mobile communication system which require minimal consumption of power and compact size, the VLC in the related art would not be efficient.

OBJECTIVES OF THE INVENTION

An object of the present invention is to solve at least the problems and disadvantages of the related art.

An object of the present invention is to provide a simplified VLC for a video coder and encoding method. Therefore, an object of the present invention is to provide a simplified bit packer of a VLC.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

To achieve the objects and in accordance with the purposes of the invention, as embodied and broadly described herein, the present VLC includes a VLC code generator generating and outputting code information and code length information based upon the input symbols; a code buffer storing the code information output from the VLC code generator and outputting the code information at a constant rate; a length buffer storing the code length information output from the VLC code generator and outputting the code length information at a constant rate; and a one bit packer transmitting the code information output from the code buffer based upon the code length information output from the length buffer. According to the channel clock, the present bit packer reads the code information and counts the codes for the duration of the code length to output the code information.

In another embodiment, a second bit packer receives the code information from the first bit packer. A channel buffer stores the code information from the second bit packer and outputs the codes at a constant rate.

The encoding method for using the VLC according to the present invention includes storing the input code information and the code length information in a buffer; and outputting the stored code information based upon the code length information.

The bit packer in the related art requires a complicated hardware with numerous logic gates. In contrast, the present invention allows a bit packer with a single parallel-to-serial register and a single counter, thereby requiring low power consumption and allowing a compact size. Thus, the present invention is useful in mobile communication, such as in cellular phones.

BRIEF DESCRIPTION OF THE DRAWING

The invention will be described in detail with reference to the following drawings in which like reference numerals refer to like elements wherein:

FIG. 7 shows the operation of the bit packer in FIG. 5.

DETAILED DESCRIPTION OF THE INVENTION

In the present invention, the VLC may be implemented utilizing one or two bit packers, depending upon the amount of information to be processed. Also, each bit packer is simply implemented utilizing one register and one counter. Reference will now be made in detail to the preferred embodiments of the present invention, examples of which are illustrated in the accompanying drawings.

Figure 1:
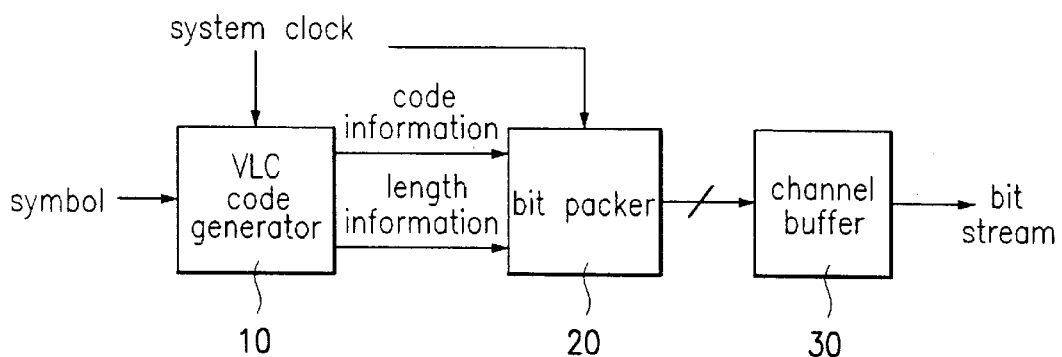
FIG. 1 shows a VLC in the related art.
Figure 2:
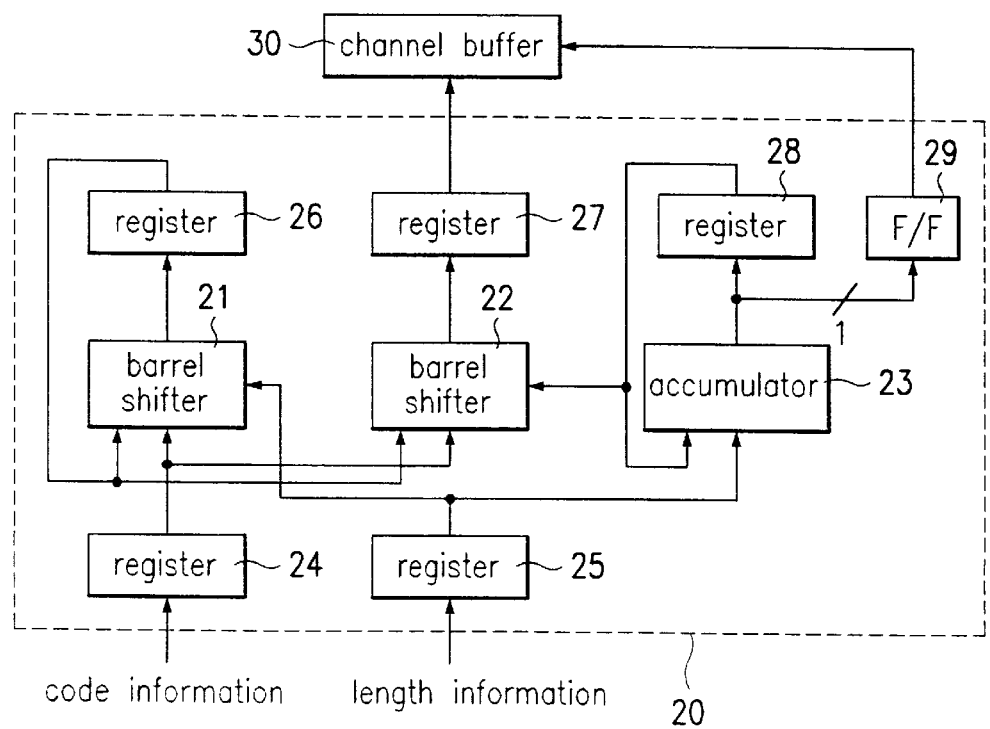
FIG. 2 shows a bit packer of the VLC in FIG. 1.
Figure 3:
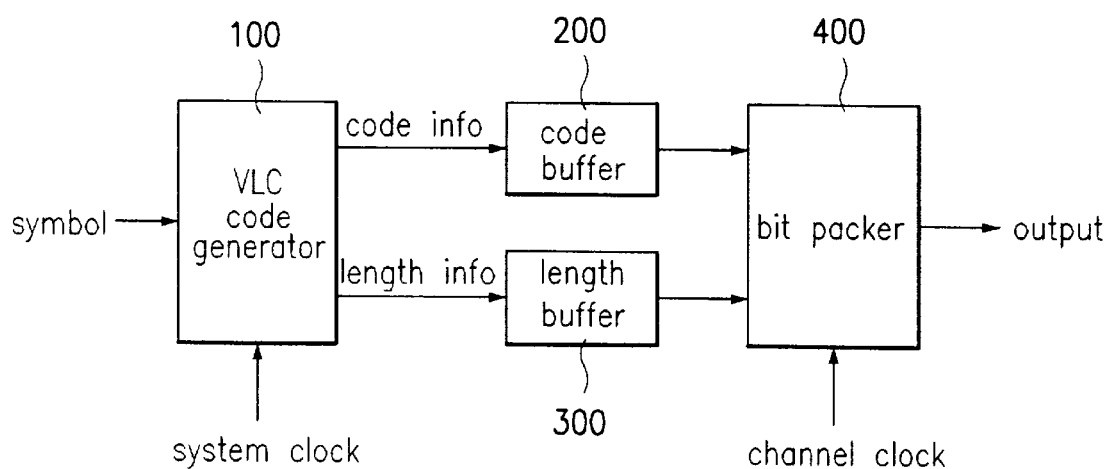
FIG. 3 shows an embodiment of a VLC in accordance with the present invention.

FIG. 3 shows a first embodiment of a VLC according to the present invention, including a VLC code generator 100 generating and outputting the code information and the code length information, using the input symbol; a code buffer 200 storing the code information from the VLC code generator 100 and outputting the code information at a constant rate; a length buffer 300 storing the code length information from the VLC code generator 100 and outputting the code length information at a constant rate; and a bit packer 400 outputting the code information based upon the code length information.

Figure 4:
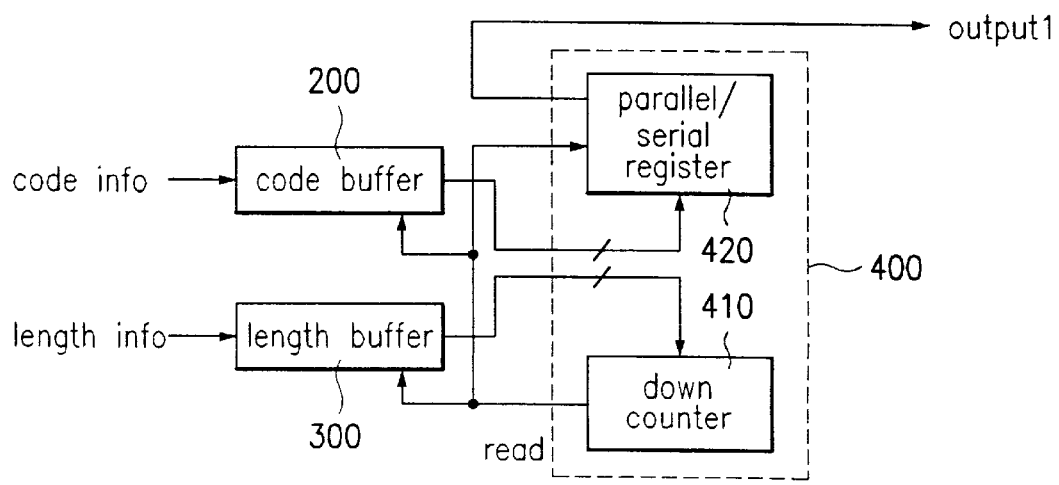
FIG. 4 shows a bit packer used in the VLC of FIG. 3.

According to a channel clock, the bit packer 400 reads the code information and outputs code bits for a duration based upon the code length. Thereafter, the bit packer reads the next code information and continues to output the code bits based upon the new code length read. Particularly, the bit packer 400 includes a parallel-to-serial (parallel/serial) register 420 and a down counter 410, as shown in FIG. 4. The parallel/serial register 420 reads the code information from the code buffer 200 in parallel. At the same time, the down counter 410 reads the code length information and counts down for each code bit output from the parallel/serial register 420. Namely, the down counter 410 begins counting down from the value of the code length read to a value of '0.' Per each count, the parallel/serial register 420 serially outputs a code bit of the code information read from the code buffer 200.

Referring to FIG. 7, a sample operation of the bit packer 400 is shown in the first four columns of the table. At time 0, upon receiving the read signal, the parallel/serial register 420 and the down counter 410 read the code and code length information from the code buffer 200 and length buffer 300, respectively. At time 1, the parallel/serial register 420 stores '000xxxxx' and the down counter 410 stores a value of '2'. Note that the significant bit length is three, but the down counter 410 reads one less than the actual value, i.e. 2. At time 2, the stored bit stream is left-adjusted or shifted and the parallel/serial register 420 stores '00xxxxxx.' The most significant bit (MSB), i.e. the leftmost bit, is output from the VLC. The value stored in the down counter 410 reduces from '2' to '1.' At time 3, the stored bit stream is again left-adjusted and the parallel/serial register 420 stores '0xxxxxxx' while the down counter stores '0.'

By time 4, the code information read at time 0 is completely output and a new read signal is generated. Essentially, a count value of '0' informs the bit packer 400 that the code information is output and to generate a new read signal. Thus, at time 4, upon receiving the read signal, the parallel/serial register 420 and the down counter 410 read the next code information of '01xxxxxx' and code length information of '1' from the code buffer 200 and length buffer 300, respectively. Thereafter, the bit stream stored in the parallel/serial register 420 is left-adjusted and output serially until the count value becomes '0,' at which time a new code information is read again. Accordingly, the bit packer 400 outputs the code information from the VLC based upon the code length information.

Figure 5:
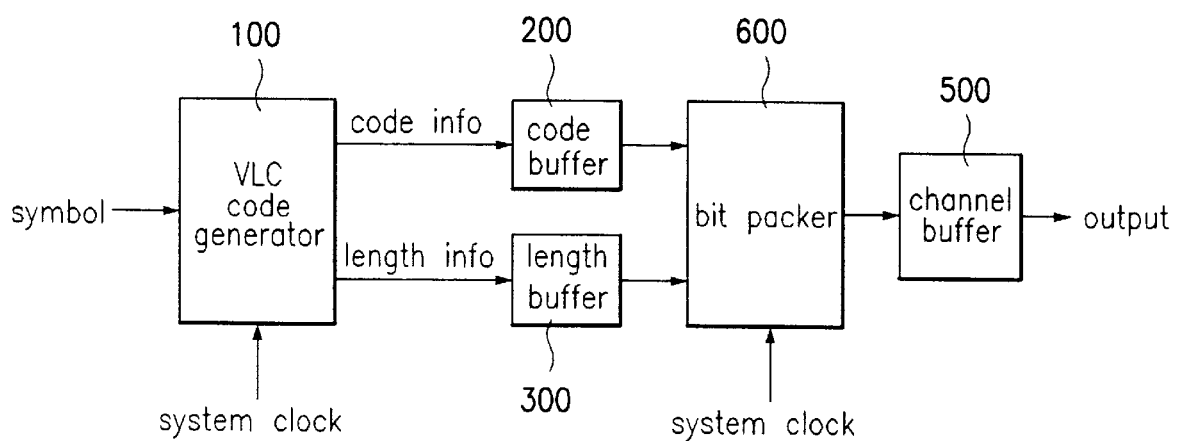
FIG. 5 shows another embodiment of a VLC in accordance with the present invention.

FIG. 5 shows another embodiment of a VLC according to the present invention, including a VLC code generator 100; a code buffer 200; and a length buffer 300 as in the first embodiment of the VLC shown in FIG. 3. The VLC further includes a bit packer 600 reading and storing the code information; and a channel buffer 500 storing the code information from the bit packer 600 and outputting the code information at a constant rate.

Figure 6:
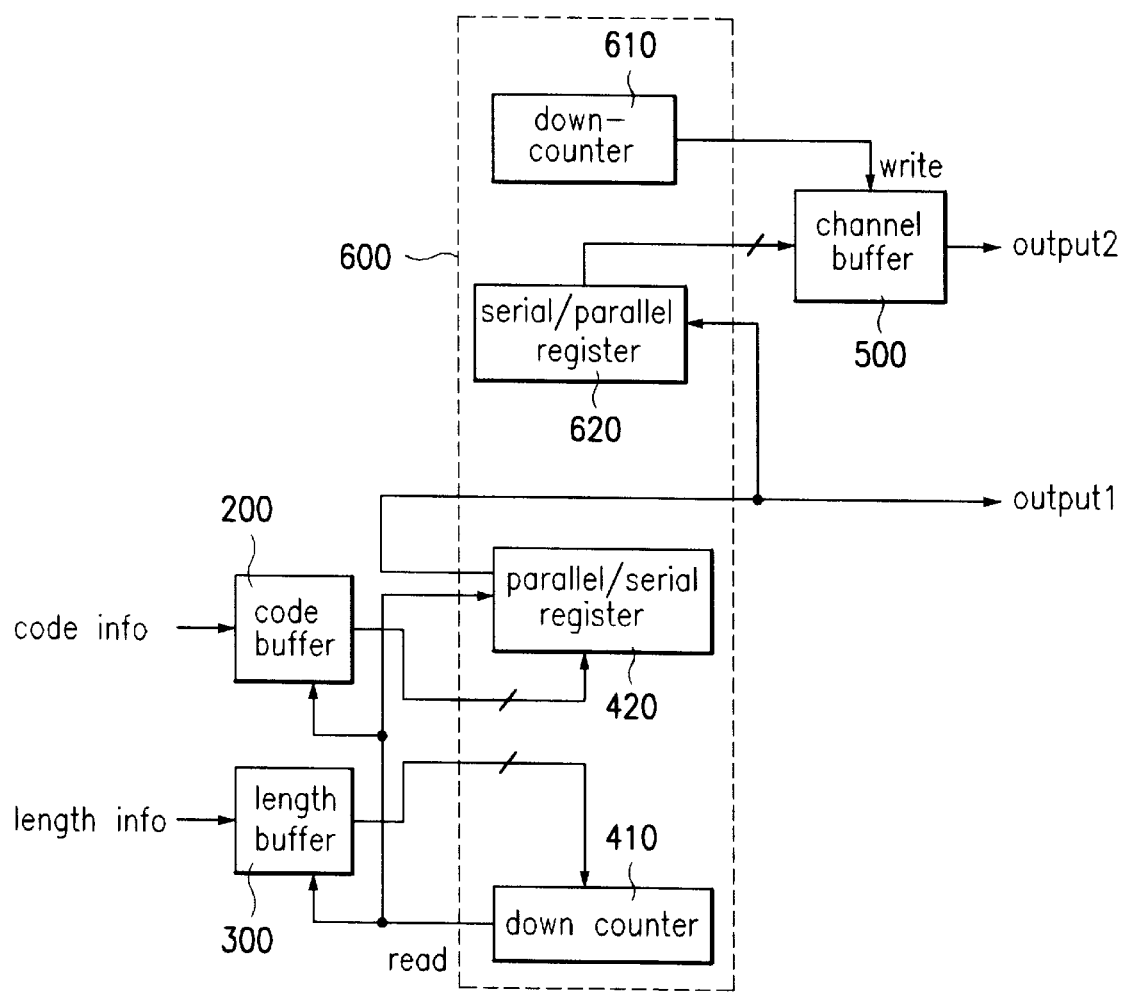
FIG. 6 shows a bit packer used in the VLC of FIG. 5.

As shown in FIG. 6, the bit packer 600 is essentially two bit packers, wherein the first bit packer is equivalent to the bit packer 400 of the first embodiment shown in FIG. 3. Particularly, the bit packer 600 includes a parallel/serial register 420 reading and outputting the code information from the code buffer 200; a first down counter 410 counting down from the code length value read; a serial/parallel register 620 receiving and concatenating code bits from the parallel/serial register 420; and a second down counter 610 counting bits for the predetermined code length. The parallel/serial register 420 and the first down counter 410 function in the same manner as in FIG. 3, except the bit stream stored in the parallel/serial register 420 is output to the serial/parallel register 620, according to the system clock.

The serial/parallel register 620 concatenates and stores the input bit stream from the parallel/serial register 420 until the predetermined code length is reached. As the input bit stream is stored in the serial/parallel register 620, the second down counter 610 counts from a value of one less than the predetermined code length to '0'. For example, if the predetermined code length is '8,' the second down counter counts from '7' to '0.' Each time the second down counter 610 attains a value of '0,' the bit stream stored in the serial/parallel register 620 reaches the predetermined code length and is output, in parallel, to the channel buffer 500. The channel buffer 500 then outputs the code information at a constant rate.

FIG. 7 is a table showing a sample operation of the bit mapper 600, wherein the predetermined code length is 8. Similar to FIG. 3, at time 0, the code information and length information are read. At time 1, the parallel/serial register 420 stores '000xxxxx' while the down counter 410 stores a value of '2' and at time 2, the parallel/serial register 420 stores '00xxxxxx' while the down counter 410 stores '1.' Also at time 2, the serial/parallel register 620 receives the MSB from the parallel/serial register 420 and stores the bit stream 'xxxxxxx0.' When the serial/parallel register 620 begins to receive the MSB, the second down counter 610 begins counting down from '7.'

For each count, the serial/parallel register 620 receives and concatenates the MSBs from the parallel/serial register 420. As a result, the serial/parallel register 620 fills with the least significant bit (LSB), i.e. the rightmost bit, as the bit stream stored in the serial/parallel register 620 is left-adjusted. When the count value in the second down counter 610 is '0,' the sum of the bits stored in the serial/parallel register 620 reaches the predetermined code length. Thus, at time 9, the bit stream of the predetermined code length '00001100' is output from the serial/parallel register 620 of the bit packer 600 to the channel buffer 500. Thereafter at time 10, the second counter 610 begins counting again from '7' as the serial/parallel register 620 continues to receive and concatenate the MSB from the parallel/serial register 420.

By utilizing a code buffer to store the code information and a length buffer to store the length information, the present invention significantly simplifies the bit packer of the VLC. Although the embodiment in FIG. 5 requires additional logic gates as compared to the VLC in FIG. 3, the operation clock used in FIG. 5 is a system clock in units of MHz which is much faster than the channel clock of approximately 10–100 KHz. Accordingly, the size of the memory may be decreased in the code buffer 200 and the length buffer 300 of FIG. 5.

As a result, the VLC with a simple bit packer 400 shown in FIG. 4 may be utilized, if the amount of information to be processed is small. However, if a large amount of information need to be stored and processed, in consideration of the memory sizes of the code buffer and the length buffer, the VLC with bit packer 600 as shown in FIG. 6 may be utilized to reduce the overall memory size, even with the more complicated hardware.

Moreover, although the present embodiments of the VLC in FIGS. 3 and 5 use a down counter, an up counter may be utilized in the bit packers 400 and 600. In such case, a first up counter would replace the down counter 410, and a second up counter would replace the own counter 610. More particularly, as the parallel/serial register 420 reads and outputs the code information, the first up counter reads the code length information and counts up until the value of the code length read is reached. A comparator may be implemented to indicate when the code length read is reached, and upon reaching the code length, the parallel/serial register 620 and the up counter reads the next code and code length information. For the to down counter 610, the second up counter may simply replace the down counter and count up rather than down for the predetermined code length. Thus, for a predetermined code length of '8,' the second up counter counts from '0' to '7' and upon reaching '7', the bit stream stored in the serial/parallel register 620 is output to the channel buffer 500.

In sum, by utilizing a separate code and length buffers, the present invention simplifies the bit packer of the VLC. Accordingly, the simplified VLC has a much lower power consumption than the VLC in the related art and can be implemented in a compact device such as a mobile phone in the wireless communication. Also, the present invention may be implemented in an image processing and transmitting technology which has a transmission rate of 10 to 100 kbps.

The foregoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A variable length coder (VLC), comprising:
   a VLC code generator coupled to receive input symbols and generate code information and code length information;
   a code buffer coupled to store the code information from the VLC code generator and output the code information at a constant rate;
   a length buffer coupled to store the code length information from the VLC code generator and output the code length information at a constant rate; and
   a bit packer coupled to receive the code information from the code buffer and the code length information from the length buffer, and to output code bits according to the code length information and provide a feedback signal to at least one of the code buffer and the length buffer.

2. The VLC of claim 1, wherein the bit packer comprises:
   a parallel/serial register configured to read the code information upon receiving a read signal; and
   a first counter configured to read the code length information upon receiving the read signal and counting for a duration of the code length, wherein the parallel/serial register outputs code bits of the code information while the first counter counts for the duration of the code length.

3. The VLC of claim 2, wherein the first counter comprises a down counter configured to count down from a value that is one less than the code length to '0,' and outputs the read signal when the down counter reaches a value of '0.'

4. The VLC of claim 2, wherein the first counter comprises an up counter and the up counter counts up from '0' to a value that is one less than the code length, and outputs the read signal when the up counter reaches the value which is one less than the code length.

5. The VLC of claim 2, wherein the bit packer further comprises:
   a serial/parallel register coupled to receive the code bits from the parallel/serial register;
   a second counter configured to count a duration of a prescribed code length; and
   a channel buffer coupled to store code bits output from the serial/parallel register and outputting code bits at a constant rate, wherein the serial/parallel register concatenates the received code bits for the duration of the prescribed code length, and outputs the concatenated code bits to the channel buffer when the second counter attains a prescribed count value.

6. The VLC of claim 5, wherein the first counter is a down counter that counts down from a value that is one less than the code length to '0,' and outputs the read signal when the down counter reaches a value of '0.'

7. The VLC of claim 5, wherein the first counter is an up counter counts up from '0' to a value that is one less than the code length, and outputs the read signal when the up counter reaches the value which is one less than the code length.

8. The VLC of claim 5, wherein the second counter is a down counter that counts down from a value that is one less than the prescribed code length to '0,' and wherein the serial/parallel register outputs the concatenated code bits when the down counter reaches a value of '0.'

9. The VLC of claim 5, wherein the second counter is an up counter that counts up from '0' to a value which is one less than the prescribed code length, and wherein the serial/parallel register outputs the concatenated code bits when the down counter reaches the value which is one less than the predetermined code length.

10. The VLC of claim 5, wherein the serial/parallel register receives MSBs from the parallel/serial register.

11. The VLC of claim 1, wherein the feedback signal controls a reading of the code information by the bit packer.

12. The VLC of claim 1, wherein the bit packer reads code information in parallel and outputs code bits serially.

13. The VLC of claim 2, wherein the parallel/serial register outputs a single code bit at each count of the first counter.

14. A method of variable length coding input symbols, comprising:
   (a) generating and outputting code information and code length information from input symbols;
   (b) storing the code information in a code buffer and outputting the code information at a constant rate;
   (c) storing the code length information in a length buffer and outputting the code length information at a constant rate; and
   (d) receiving the code information from the code buffer and outputting the code information and a control signal based upon the code length information, wherein the control signal is provided to at least one of the code buffer and the length buffer.

15. The method of VLC of claim 14, wherein in step (d) further comprises:
(aa) reading the code information and reading the code length information upon receiving a read signal;
(bb) counting for a duration of the code length read; and
(cc) outputting code bits of the code information while counting for the duration of the code length.

16. The method of claim 15, wherein step (bb) comprises counting down from a value that is one less than the code length to '0,' and outputting the read signal when a count reaches a value of '0.'

17. The method of claim 15, wherein step (bb) comprises counting up from '0' to a value that is one less than the code length, and outputting the read signal when a count reaches the value that is one less than the code length.

18. The method of claim 15, wherein step (d) further comprises:
(dd) counting for the duration of a prescribed code length;
(ee) receiving and concatenating the code bits while counting for the duration of the prescribed code length;
(ff) outputting and storing the concatenated code bits to a buffer when the count attains a prescribed value; and
(gg) outputting the stored code bits at a constant rate.

19. The method of claim 18, wherein step (bb) comprises counting down from a value that is one less than the code length to '0,' and outputting the read signal when a count reaches a value of '0.'

20. The method of claim 18, wherein step (bb) comprises counting up from '0' to a value that is one less than the code length, and outputting the read signal when a count reaches the value that is one less than the code length.

21. The method of claim 18, wherein step (dd) comprises counting down from a value that is one less than the prescribed code length to '0,' and wherein step (ff) comprises outputting the concatenated code bits when the count reaches a value of '0.'

22. The method of claim 18, wherein step (dd) comprises counting up from '0' to a value that is one less that the prescribed code length, and wherein step (ff) comprises outputting the concatenated code bits when the count reaches the value that is one less than the predetermined code length.

23. The method of claim 14, wherein the control signal controls a reading of the code information.

24. The method of claim 14, wherein a bit packer receives the code information and generates the control signal.

25. A method of bit packing input code information of a variable length coder (VLC) in a wireless communication device, comprising:
reading the code information and code length information upon receiving a read signal;
counting for a duration of the code length read and generating the read signal at a prescribed count; and
outputting code bits of the code information while counting for the duration of the code length.

26. The method of claim 25, wherein the read signal controls the reading of the code information.

27. The method of claim 25, wherein a bit packer reads the code information from a code buffer and performs the counting, and wherein the read signal is fed back from the bit packer to the code buffer.

* * * * *